(12) United States Patent
Joyce et al.

(10) Patent No.: US 9,377,912 B2
(45) Date of Patent: Jun. 28, 2016

(54) MOBILE ELECTRONIC DEVICE COMPRISING A MODIFIED SAPPHIRE

(71) Applicant: GTAT Corporation, Merrimack, NH (US)

(72) Inventors: David B. Joyce, Marblehead, MA (US); John Q. Dumm, Boxford, MA (US); James M. Zahler, Winchester, MA (US)

(73) Assignee: GTAT Corporation, Merrimack, NH (US)

( * ) Notice: Subject to any disclaimer, the term of this patent is extended or adjusted under 35 U.S.C. 154(b) by 185 days.

(21) Appl. No.: 14/100,350

(22) Filed: Dec. 9, 2013

(65) Prior Publication Data

US 2014/0160649 A1    Jun. 12, 2014

Related U.S. Application Data

(60) Provisional application No. 61/735,761, filed on Dec. 11, 2012.

(51) Int. Cl.
*G06F 1/16* (2006.01)
*H05K 5/00* (2006.01)
*H05K 7/00* (2006.01)
*H01L 21/00* (2006.01)
*G06F 3/044* (2006.01)

(52) U.S. Cl.
CPC .............. *G06F 3/044* (2013.01); *G06F 1/1637* (2013.01)

(58) Field of Classification Search
CPC ....... G06F 1/16; G06F 1/1637; G06F 1/1656; H04M 1/0202; H04M 1/0266
USPC .............. 361/679.01, 679.02, 679.21–679.3; 438/27, 30
See application file for complete search history.

(56) References Cited

U.S. PATENT DOCUMENTS

| | | | | |
|---|---|---|---|---|
| 4,088,799 | A * | 5/1978 | Kurtin | H01B 1/00 148/33.3 |
| 6,094,158 | A * | 7/2000 | Williams | A61H 3/061 342/157 |
| 6,982,181 | B2 * | 1/2006 | Hideo | G02F 1/136277 438/30 |
| 9,092,187 | B2 * | 7/2015 | Kwong | G06F 1/1601 |
| 2005/0130400 | A1 | 6/2005 | Grupp et al. | |
| 2010/0224944 | A1 | 9/2010 | Ahn et al. | |
| 2011/0237025 | A1 | 9/2011 | Yamazaki | |
| 2012/0212890 | A1 * | 8/2012 | Hoshino | H04M 1/0202 361/679.01 |
| 2012/0255762 | A1 | 10/2012 | Katagiri et al. | |

OTHER PUBLICATIONS

International Search Report dated Mar. 27, 2014 issued in connection with PCT/US2013/074091.

* cited by examiner

*Primary Examiner* — Anthony Haughton
(74) *Attorney, Agent, or Firm* — Parker Ibrahim & Berg LLC; Stephen D. LeBarron

(57) ABSTRACT

An electronic device comprising a cover plate is disclosed. The cover plate comprises at least one layer of modified sapphire having a dielectric constant that is higher than the dielectric constant of sapphire.

24 Claims, 1 Drawing Sheet

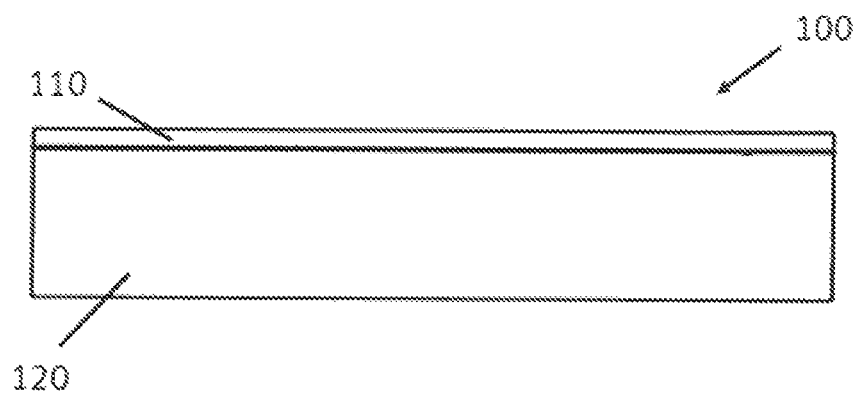

MOBILE ELECTRONIC DEVICE COMPRISING A MODIFIED SAPPHIRE

CROSS-REFERENCE TO RELATED APPLICATION

This application claims the benefit of U.S. Provisional Application Ser. No. 61/735,761 filed Dec. 11, 2012, the teachings of which are incorporated herein by reference.

BACKGROUND OF THE INVENTION

1. Field of the Invention

The present invention relates to a mobile electronic device comprising a sapphire cover plate, particularly a cover plate comprising a modified sapphire having a dielectric constant greater than the dielectric constant of sapphire.

2. Description of the Related Art

There are many types of mobile electronic devices currently available which include a display window assembly that is at least partially transparent. These include, for example, handheld electronic devices such media players, mobile telephones (cell phones), personal data assistants (PDAs), pagers, tablets, and laptop computers and notebooks. The display screen assembly may include multiple component layers, such as, for example, a visual display layer such as a liquid crystal display (LCD), a touch sensitive layer for user input, and at least one outer cover layer used to protect the visual display. Each of these layers are typically laminated or bonded together.

Touch sensitive screen applications are very popular for many mobile electronic devices because they eliminate mechanical push button components that can wear and fail and because they can be incorporated into as more visually appealing form factor for the device. The majority of such touch screens rely on sensing the capacitance within electronic circuits that are mounted in close proximity to or constructed upon the window assembly. These capacitance sensing touch screens have the advantage over other technology that they have no moving parts and do not rely on pressure or flexure to actuate, eliminating wear and extending useful lifetime.

The capacitance sensing electronics in these touch screens are used to locate the position of a probe, such as a user's finger, with respect to the screen. As the probe approaches die electronic circuits, the native capacitance in circuits is altered by the additional capacitance provided by the electric field surrounding the probe. This phenomenon is referred to as projected capacitance.

The capacitance sensing components of the touch screen electronics are distributed along some grid on a horizontal plane. The electronic circuit is designed to locate the x and y coordinates of those components most strongly affected by the electric field of the approaching probe, thus locating the probe position with respect to the touch screen coordinates. These touch screen electronic circuits are designed to maximize the precision with which this coordinates are determined. Higher precision improves the ease of use and the functionality a the user interface provided by the touch screen. The sensitivity of these circuits to the electric field surrounding the probe is directly impacted by the electrical properties of the material used to prepare the touch screen, including its dielectric constant.

In addition, the mechanical properties of the touch screen material are also important. Many of the mobile electronic devices used today are subjected to excessive mechanical and/or chemical damage, particularly from careless handling and/or dropping, from contact of the screen with items such as keys in a user's pocket or purse, or from frequent touch screen usage. For example, the touch screen surface and interfaces smartphones and PDAs can become damaged by abrasions that scratch and pit the physical user interface, and these imperfections can act as stress concentration sites making the screen and/or underlying components more susceptible to fracture in the event of mechanical or other shock. Additionally, or from the use's skin or other debris can coat the surface arid may further facilitate the degradation of the device. Such abrasion and chemical action can cause a reduction in the visual clarity of the underlying electronic display components, thus potentially impeding the use and enjoyment of the device and limiting its lifetime.

Various methods and materials leave been used in order to increase the durability of the display windows of mobile electronic devices. For example, polymeric coatings or layers can be applied to the touch screen surface in order to provide a barrier against degradation. However, such layers can interfere, with the visual clarity of the underlying electronic display as well as interfere with the touch screen sensitivity. Furthermore, as the coating materials are often also soft, they can themselves become easily damaged, requiring periodic replacement or limiting the lifetime of the device.

Another common approach is to use more highly chemically and scratch resistant materials as the outer surface of the display window. For example, touch sensitive screens of some mobile devices may include a layer chemically-strengthened alkali aluminosilicate glass, with potassium on replacing sodium ions for enhanced hardness, such as the material referred to as Gorilla® glass available from Corning. However, even this type of glass can be scratched by many harder materials, including metal keys, sand, and pebbles, and, further, as a glass, is prone to brittle failure or shattering. Sapphire has also been suggested and used as a material for either the outer layer of the display assembly or as a separate protective sheet to be applied over the display window. However, sapphire is relatively expensive, particularly at the currently available thicknesses.

Thus, while materials are available which can enable the display of a mobile electronic device to be relatively resistant to damage, there remains a need in the industry for materials that provide improved mechanical toughness and scratch resistance without reducing the propagation of the electric field, particularly for touch sensitive screen applications.

SUMMARY OF THE INVENTION

The present invention relates to an electronic device comprising a cover plate having at least one transparent display region. The cover plate comprises at least one layer of modified sapphire having a dielectric, constant greater than a dielectric constant of sapphire. Preferably the modified sapphire has a dielectric constant that is at least about 0.05% greater than the dielectric constant of sapphire, when measured under the same conditions, including 0.1 and 0.5% greater. The electronic device may further comprise at least one display element having a display surface, and the cover plate can be either affixed to the display surface or removably positioned on top of the display surface as a protective layer.

It is to be understood that both the foregoing general description and the following detailed description are exemplary and explanatory only and are intended to provide further explanation of the present invention, as claimed.

BRIEF DESCRIPTION OF THE DRAWINGS

FIG. 1 illustrates the cover plate of the electronic device of the present invention.

DETAILED DESCRIPTION OF THE INVENTION

The present invention relates to an electronic device comprising a cover plate, wherein the cover plate comprises a modified sapphire having a higher dielectric constant than sapphire.

As shown in FIG. 1, the electronic device of the present invention comprises a cover plate 100 having at least one transparent display region through which an image can be displayed, such as from a display element upon which the cover plate is placed. Non-transparent regions may also be present, particularly as decorative elements such as borders or as elements to delineate various functional sections of the display. The electronic device can be any known in the art comprising a display or display element, such as mobile or portable electronic devices including, but not limited to, electronic media players for music and/or video, such as an mp3 player, mobile telephones (cell phones), personal data assistants (PDAs), pagers, laptop computers, or electronic notebooks or tablets. The display element of the device may include multiple component layers, including, for example, a visual display layer such as an LCD and a touch sensitive layer as part of a touch screen application. The cover plate can be affixed to the display surface of the display element of the device or it can be a separate protective layer that can be placed or positioned over or on top of the display element and later removed if desired.

Referring back to FIG. 1, the cover plate of the electronic device of the present invention comprises a modified sapphire layer 110 having a higher dielectric constant than sapphire, described in more detail below. The cover plate may be a single, free-standing modified sapphire layer or it may comprise additional layers 120, including additional sapphire layers, modified sapphire layers, or layers of other materials capable of providing further beneficial properties, such as improved mechanical or surface properties, including hardness or resistance to cracking. For example, the cover plate may comprise an antireflective and/or oleophobic coating, typically having a thickness of from about 0.001 microns to about 1.5 microns. Thus, the cover plate can be a multilayer composite comprising at least one of modified sapphire having a higher dielectric constant than sapphire. Preferably, particularly for cost reasons, the cover plate comprises a single layer of modified sapphire.

The overall thickness of the cover plate of the electronic device of the present invention can vary depending on a variety of factors, including, for example, the number of layers and the desired size and weight of the electronic device. In general, the cover plate has a thickness that is less than about 5 mm and preferably has a thickness of from about 0.3 mm to about 3.0 mm. However, since the cover plate of the present invention comprises at least one layer of modified sapphire having improved dielectric properties, the present cover plates can be thinner than cover plates comprising unmodified (standard) sapphire as well as cover plates comprising glass while, at the same time, achieving the same level of desired properties such as touch screen sensitivity, rigidity, and strength. Thus, for example, the cover plate more preferably has a thickness between about 0.4 mm to about 2.5 mm, even more preferably from about 0.5 mm to about 2.0 mm, and most preferably between about 0.5 mm and about 1.0 mm.

As discussed above, the touch screens of many electronic devices rely on sensing the capacitance within electronic circuits that are mounted in close proximity to or constructed upon a display element. As a probe, such as a user's finger approaches the electronic circuits, the native capacitance of these circuits is altered by the additional capacitance provided by the electric field surrounding the probe. The touch screen electronic circuits are designed to maximize the precision with which the position of the probe is determined, and the sensitivity of these circuits to the electric field surrounding the probe is directly impacted by the dielectric constant of the touch screen material, which is a measure of the ease with which an electric field will propagate across that material.

The modified sapphire used as a layer for the cover plate of the electronic device of the present invention has a high dielectric constant, and, more specifically, has a dielectric constant that is higher than unmodified sapphire measured under the same conditions, since the dielectric constant of a material is known to vary depending on such conditions as the frequency and temperature at which it is measured. For sapphire, the dielectric constant is also known to vary depending on crystal orientation. For example, sapphire has a reported dielectric constant of 11.5 at 103-109 Hz and at 25° C. parallel to the C-axis and a dielectric constant of 9.3 under the same conditions perpendicular to the C-axis. Generally, the dielectric constant of sapphire is considered to be 10. Thus, the modified sapphire of the cover plate of the electronic device of the present invention has a dielectric constant that is higher than these values.

Preferably, the modified sapphire has a dielectric constant that is at least about 0.05% higher than the dielectric constant of sapphire, is at 0.1% and about 0.5% greater, when measured under the same conditions. Modified sapphire having values that are not at least 0.05% higher than sapphire would not be expected to provide a significant enough improvement in performance as a cover plate for an electronic device while modified sapphire having values greater than this may show poorer mechanical, physical, or optical properties, such as hardness, scratch resistance, or clarity. Such increases are significant since increasing the dielectric constant of sapphire is generally considered to be very difficult, and, as a result, sapphire having a higher dielectric constant is not generally known. For example, a typical method of modifying the bulk electrical properties of a material is to combine the material with a dopant. However, for sapphire, dopants cannot be incorporated readily or at significant concentrations, due, in part to its crystallinity as well as due to the extremely high temperature conditions needed to form this crystalline material. This is particularly true for sapphire formed from an alumina melt by directional solidification. Therefore, even small changes in the dielectric constant of sapphire would be considered significant, and these would be expected to provide enhanced performance properties for a cover plate of an electronic device.

Since the cover plate of the electronic device of the present invention comprises a modified sapphire material having a dielectric constant that is higher compared to generally known cover plate materials, more of the electric field surrounding the probe would be expected to be propagated through the modified sapphire having a high dielectric constant, and thus the effect of the projected capacitance would be stronger on the capacitance sensing components. This would culminate in either greater accuracy in the determination of the probe's position tor a given thickness of window and/or would allow the use of a thicker window for greater strength. The improvement can also be used to offset lost propagation caused by other layers of materials placed between the probe and the electronics, such as adhesives, glues, antireflection coatings, color filters or the like, which are used to improve the strength, durability, functionality or aesthetics of the device. The choice would be dictated by the demands of the application. The higher dielectric constant of the modified sapphire would therefore be expected to dramatically increase performance along with provided improved design flexibility.

The modified sapphire can be prepared using a variety of different methods. For example, in one embodiment of the present invention, the modified sapphire is solidified from a sapphire melt containing at least one doping agent, and the layer of modified sapphire is sawn or cut from the resulting body of modified sapphire. The sapphire melt can be formed using any apparatus known the art, including, for example, a crystal growth apparatus, which is a high-temperature furnace capable of heating and melting solid feedstock, such as alumina, at temperatures generally greater than about 1000° C. and subsequently promoting resolidification of the resulting melted feedstock material to form a crystalline material, such as a sapphire boule. As a particular example, the modified sapphire can be prepared by placing alumina feedstock and at least one doping agent into a crucible provided within the hot zone of a crystal growth apparatus, heating the feedstock and doping agent to form a melt, and subsequently resolidifying to form a body of modified sapphire. For this embodiment, preferably the modified sapphire is prepared in a heat exchanger method crystal growth furnace, in which a crucible comprising feedstock, such as alumina, and at least one single crystal seed, such as a sapphire seed, is heated above its melting point to melt the feedstock without substantial melting of the seed, and the heat is then removed from the crucible using a heat exchanger, such as a helium-cooled heat exchanger, provided in thermal communication with the bottom of the crucible and positioned under the seed. This method has been shown to produce large, high quality sapphire boules. Once a body of modified sapphire is formed, from which the modified sapphire layer can be removed.

For this embodiment, the doping agent can be any material capable of modifying the crystallization of sapphire without detrimentally affecting its overall properties, generally becoming incorporated within the lattice of the resulting crystal. For example, the doping agent can be a chloride, such as calcium chloride, aluminum chloride, or molybdenum chloride. These would be expected to remain relatively stable under the conditions needed for melting and resolidifying alumina to form the modified sapphire. Other types of doping agents include, for example, sulfides or sulfates (such as aluminum sulfide, aluminum sulfate, or calcium sulfate) and aluminates (such as sodium aluminate or lithium aluminate). In addition, the doping agent may be a metal ion-containing compound, particularly those comprising iron, titanium, chromium, magnesium, gallium, or calcium. These agents, which may be oxides or aluminates, would be expected to produce a modified sapphire comprising these metal elements as part of the resulting crystal lattice.

The doping agent is added in an amount sufficient to produce a modified sapphire having the desired increased dielectric constant, discussed above. The amount of a specific doping agent may be different for each type of doping agent and will generally depend on the chemical stability of the material, particularly its stability to the high temperature furnace conditions needed to melt and resolidify the alumina feedstock. A relatively higher amount would be needed for those that are prone to decompose and/or evaporate under these conditions, while relatively less is needed for the more chemically stable agents. The specific amount of a particular doping agent can be determined by routine experimentation by one of ordinary skill in the art.

In addition, the doping agent may react with alumina from which sapphire is prepared, forming a compound which subsequently decomposes within the modified sapphire crystal, creating vacancies. For example, the doping agent may be carbon which can be added with the alumina feedstock in levels such as between about 0.01% to about 1.0% by weight. During the melting and resolidification, the carbon would be expected to react with the alumina, forming an intermediate that upon incorporation into the crystal lattice, would create oxygen vacancies. These oxygen vacancies can be traps for electrons that can modify the polarizability and thus the dielectric constant for the material. The resulting modified sapphire with these oxygen vacancies would be expected to have a significantly higher dielectric constant than sapphire, For example, a carbon modified sapphire could have a dielectric constant that is twice (i.e., 100% higher) than that of unmodified sapphire, measured under the same conditions.

Alternatively, in another embodiment of the present invention, the modified sapphire is prepared by irradiation. For example, a sapphire body can be prepared using any method known in the art, including any of the directional solidification methods described above. The resulting material can then be irradiated with high energy radiation, such as hard x-rays or gamma rays. The irradiation can occur on the entire sapphire body or on a portion removed from the grown sapphire, including, for example, on a layer of sapphire sawn or cut from the sapphire. High energy irradiation would be expected to induce chemical changes with the crystal lattice, such as by creating aluminum and/or oxygen vacancies, thereby producing a modified sapphire having a higher dielectric constant, than the sapphire from which it was prepared. Alternatively, the irradiation could be applied to modified or doped sapphire to promote electrons to occupy the oxygen vacancies that were produced by the doping, enhancing the dielectric constant of the doped material.

While the modified sapphire described above has a dielectric constant that is higher than that of sapphire, the modified sapphire preferably also has mechanical, physical, and/or optical properties that are similar to bulk sapphire. For example at room temperature, the layer of modified sapphire preferably has a flexural strength of at least about 700 MPA, including between about 800 and 1000 MPa, a fracture toughness (i.e., the ability of the material containing a crack or scratch to resist fracture) of greater than 1 MPa, including between about 2 and 5 MPa, a Knoop hardness of greater than about 15 GPa, including between about 17 and about 20 GPa, and/or a Vickers hardness of greater about 1000 kg/m, including between about 2000 and 3000 kg/m. The modulus, such as the Young's modulus, is also similar to the modulus of bulk sapphire, which is typically between about 300-400 GPa, but can vary depending on the desired properties of the cover plate (such as touch sensitivity). Thus, modification to increase the dielectric constant does not significantly alter the overall properties of sapphire. To ensure this, it is preferred that the modified sapphire has a dielectric constant that is at most about 200% higher, including at most about 100% higher and at most about 50% higher, than the dielectric constant of sapphire.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention.

The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

The invention claimed is:

1. An electronic device comprising a cover plate having at least one transparent display region for use in an electronic display device, the cover plate comprising at least one layer of modified sapphire having a dielectric constant greater than a dielectric constant of sapphire.

2. The electronic device of claim 1, wherein the dielectric constant of the modified sapphire is at least about 0.05% greater that the dielectric constant of sapphire.

3. The electronic device of claim 1, wherein the dielectric constant of the modified sapphire is at least about 0.1% greater than the dielectric constant of sapphire.

4. The electronic device of claim 1, wherein the dielectric constant of the modified sapphire is 0.5% greater than the dielectric constant of sapphire.

5. The electronic device of claim 1, wherein the modified sapphire is solidified from a sapphire melt containing at least one doping agent.

6. The electronic device of claim 5, wherein the doping agent is a chloride.

7. The electronic device of claim 6, wherein the doping agent is calcium chloride, aluminum chloride, or molybdenum chloride.

8. The electronic device of claim 5, wherein the doping agent is a sulfide or a sulfate.

9. The electronic device of claim 8, wherein the doping agent is aluminum sulfide, aluminum sulfate, or calcium sulfate.

10. The electronic device of claim 5, wherein the doping agent is an aluminate.

11. The electronic device of claim 10, wherein the doping agent is sodium alumina t e or lithium aluminate.

12. The electronic device of claim 5. wherein the doping agent comprises iron, titanium, chromium, magnesium, gallium, or calcium.

13. The electronic device of claim 12, wherein the modified sapphire comprises iron titanium, chromium, magnesium, gallium, or calcium.

14. The electronic device of claim 5, wherein the doping agent is carbon.

15. The electronic device of claim 1, wherein the modified sapphire is sapphire irradiated with hard x-rays or gamma rays.

16. The electronic device of claim 1, wherein the cover plate has thickness between about 0.3 mm and 3.0 mm.

17. The electronic device of claim 1, wherein the cover plate has thickness between about 0.4 mm and 2.5 mm.

18. The electronic device of claim 1, wherein the cover plate has thickness between about 0.5 mm and 1.0 mm.

19. The electronic device of claim 1, wherein the electronic device further comprises at least one display element having a display surface and wherein the cover plate is affixed to the display surface.

20. The electronic device of claim 1, wherein the electronic device further comprises at least one display element having a display surface and wherein the cover plate is a protective layer removably positioned on top of the display surface.

21. The electronic device of claim 1, wherein the cover plate further comprises an exterior anti-reflective layer.

22. The electronic device of claim 1, wherein the electronic device is an electronic media player, a mobile telephone, a personal data assistant, a pager, a tablet, a laptop computer, or an electronic notebook.

23. The electronic device of claim 5, wherein the modified sapphire is solidified in a crystal growth furnace.

24. The electronic device of claim 23, where the crystal growth furnace is a heat exchanger method furnace.

* * * * *